US007025832B2

(12) United States Patent
Kim et al.

(10) Patent No.: US 7,025,832 B2
(45) Date of Patent: Apr. 11, 2006

(54) SOURCE FOR THERMAL PHYSICAL VAPOR DEPOSITION OF ORGANIC ELECTROLUMINESCENT LAYERS

(75) Inventors: Ki Beom Kim, Daeku (KR); Sang Dae Kim, Daeku (KR); Yoon Soo Han, Kyongsangbuk-do (KR); Yoon Heung Tak, Kumi-shi (KR); Seok Joo Kim, Busan (KR)

(73) Assignee: LG Electronics Inc., Seoul (KR)

( * ) Notice: Subject to any disclaimer, the term of this patent is extended or adjusted under 35 U.S.C. 154(b) by 268 days.

(21) Appl. No.: 10/621,471

(22) Filed: Jul. 18, 2003

(65) Prior Publication Data

US 2004/0016400 A1    Jan. 29, 2004

(30) Foreign Application Priority Data

Jul. 19, 2002    (KR)    ........................ 10-2002-0042271
Sep. 25, 2002    (KR)    ........................ 10-2002-0058116
Oct. 1, 2002    (KR)    ........................ 10-2002-0059786

(51) Int. Cl.
    *C23C 14/24*    (2006.01)
(52) U.S. Cl. ........................ 118/727; 118/726; 392/389
(58) Field of Classification Search ................ 118/726, 118/727; 392/289
    See application file for complete search history.

(56) References Cited

U.S. PATENT DOCUMENTS

| 6,179,923 B1 | 1/2001 | Yamamoto et al. | ......... 118/719 |
| 6,237,529 B1 | 5/2001 | Spahn | .......................... 118/726 |
| 6,837,939 B1 * | 1/2005 | Klug et al. | .................. 118/726 |

FOREIGN PATENT DOCUMENTS

| EP | 0 028 514 A1 | 5/1981 |
| EP | 0 826 434 A1 | 3/1998 |
| EP | 0 887 434 A1 | 12/1998 |
| EP | 0 967 667 A2 | 12/1999 |
| EP | 1 078 999 A2 | 2/2001 |
| EP | 1 113 087 A2 | 7/2001 |
| EP | 1 167 566 A1 | 1/2002 |
| JP | 60026660 | 2/1985 |
| JP | 60086270 | 5/1985 |
| JP | 63014861 | 1/1988 |
| JP | 2000-248358 | * 9/2000 |
| JP | 2000248358 | 9/2000 |

* cited by examiner

*Primary Examiner*—Richard Bueker
(74) *Attorney, Agent, or Firm*—Fleshner & Kim, LLP

(57) ABSTRACT

A deposition source is provided which is installed in a chamber, heated by applied electric power to transfer heat to a vapor deposition material received therein and applying a vaporized deposition material generated therein to a substrate to form deposition organic electroluminescent layers onto the substrate. The deposition source includes a vessel formed of a top plate on which a vapor efflux aperture is formed, a side wall, and a bottom wall; a heating device that supplies heat to the deposition material received in the vessel, the heating device being capable of moving vertically; and a moving device that moves the heating device (or the bottom wall), the moving device (or the bottom wall) being operated in response to the signal of a sensing device on varied distances between the heating device and the surface of said deposition material. Thus, the heating device is moved downward (or the bottom wall) is moved upward by the moving device to maintain the distance between the heating device (or the substrate to be coated) and the surface of the deposition material at an initially-set value when the thickness of the deposition material is decreased.

12 Claims, 7 Drawing Sheets

(a)

(b)

(c)

(a) Movement direction (b)

SOURCE FOR THERMAL PHYSICAL VAPOR DEPOSITION OF ORGANIC ELECTROLUMINESCENT LAYERS

FIELD OF THE INVENTION

The present invention relates to a deposition source for thermal physical vapor deposition of organic electroluminescent layers, and particularly to a deposition source capable of forming a uniform electroluminescent layer on the entire surface of a substrate by compensating increase of the distance between a deposition material and a heating means (or the substrate) from change of the thickness of the deposition material.

BACKGROUND OF THE INVENTION

Thermal physical vapor deposition process, which is one of the processes for depositing an organic electroluminescent device, is a technique to coat an electroluminescent layer on a substrate in a housing with vaporized deposition material. In the deposition process, the deposition material is heated to the point of vaporization and the vapor of the deposition material is condensed on the substrate to be coated after the deposition material is moved out of the deposition source. This process is carried out with both deposition source holding the material to be vaporized and substrate to be coated in a vessel with the pressure range of $10^{-7}$ to $10^{-2}$ Torr.

Generally speaking, the deposition source to hold the deposition material is made from electrically resistant materials whose temperature is increased when electrical current is passed through walls (member). When the electrical current is applied to the deposition source, the deposition material inside is heated by radiation heat from the walls and conduction heat from contact with the walls. Typically, the deposition source is in the shape of box with aperture to allow vapor efflux toward the direction of the substrate.

Thermal physical vapor deposition source has been used to vaporize and deposit onto the substrate layers comprised of a wide range of materials, for example, organics of low temperature, metals, or inorganic compounds of high temperature. In the case of organic layer deposition, the starting material is generally powder. Organic powder has been recognized as giving a number of disadvantages for this type of thermal vaporization coating. First, many organics are relatively complex compounds (high molecular weight) with relatively weak bonding, and so intensive care must be taken to avoid decomposition during the vaporization process. Second, the powder form can give rise to particles of non-vaporized electroluminescent materials. The particles leave the deposition source with vapor and are deposited as undesirable lumps on the substrate. Such lumps are also commonly referred to as particulate or particulate inclusion in the layers formed on the substrate.

Further exacerbation is found in that the powder form has a very large surface area enough to support water sucked in or absorbed or volatile organics, and the volatile organics can be released during heating and can cause gas and particulates to be thrown outward from the deposition source toward the substrate. Similar considerations pertain to materials which are melted before vaporization and form droplets erupted to the substrate surface.

These unwanted particulates or droplets may result in unacceptable defects in products, particularly in electronic or optical products, dark spots may appear in images, or shorts or opens may result in failures within electronic devices.

Organic deposition apparatuses have been proposed to heat the organic powder more uniformly and to prevent the bursts of particulates or droplets from reaching the substrate. Many designs for complicated baffling structures between the source material and the vapor efflux aperture have been suggested to ensure vapor exits.

FIG. 1 is a schematic sectional view showing the inner structure of a conventional apparatus for depositing an organic electroluminescent layer, and shows a deposition source 10 mounted in a vacuum chamber 13 of the deposition apparatus and a substrate 12 located above the deposition source 10. The substrate 12 to be coated with the organic electroluminescent layers is mounted to an upper plate 13-1 of the chamber 13, and the deposition source 10 to have a deposition material 20 (organic material) is mounted on a thermally insulating structure 14 fixed to a bottom wall 13-2 of the chamber 13.

FIG. 2a is a sectional view showing the inner structure of the deposition source shown in FIG. 1, and shows that a baffle 11B is provided in the deposition source 10 to prevent particulates or droplets contained in the vapor of the deposition material 20 from directly exiting through a vapor efflux aperture 11C formed on the top plate 11A of the deposition source 10. The baffle 11B corresponds to the vapor efflux aperture 11C and is fixed to a number of support rods 11B-1 fixed to the top plate 11A of the deposition source 10 to maintain certain space from the top plate 11A.

The deposition apparatus using the deposition source 10 with the above structure has a heater or a heating means on (or under) the top plate 11A, or is constructed for the top plate 11A to have a heater in order to transfer heat to the deposition material 20 located around the center away from the side wall 11D. Thus, the heat generated at the side wall 11D as well as from the top plate 11A is transferred directly to the deposition material 20 so that the deposition material 20 is heated and vaporized. The vapor of vaporized deposition material 20 is moved along the surface of the baffle 11B and deposited on the substrate 12 (in FIG. 1) after exit through the vapor efflux aperture 11C.

FIG. 2b is a sectional view showing the change of distance between the top plate of the deposition source in FIG. 1 and the deposition material after the deposition is processed for a certain amount of time. Thus, FIG. 2b shows a state that the distance between the top plate 11A and the surface of the deposition material 20 is increased.

As explained above, the quantity of the deposition material 20 received in the deposition source 10 is decreased gradually by heating and vaporizing reactions in progressing the deposition process also the thickness of the deposition material 20 is decreased. Thus, in a certain amount of time, the initial distance (A in FIG. 2a) between the top plate 11A and the surface of the deposition material 20 in the deposition source is remarkably increased (a in FIG. 2b).

Due to increase of the distance between the top plate 11A and the surface of the deposition material 20, the heat transfer path is increased so that the deposition rate (that is, vaporization rate of the deposition material) set at the initial stage is decreased. Thus, in order to maintain the initially-set deposition rate, the temperature of the top plate 11A acting as the heater heating the deposition material 20 is needed.

In particular, while the deposition process is progressed, the distance between the top plate 11A and the surface of the deposition material 20 is increased. Under this situation, the sufficient heat generated at the top plate 11A cannot reach the deposition material 20, and so the deposition material located on the center is not vaporized though the heat generated from the side wall 11D is supplied. Consequently, if the input amount of the deposition material 20 is high (that is, the thickness of the deposition material 20 is high), it is difficult to expect that all the deposition material is vaporized.

Also, the distance between the substrate 12 and the deposition material 20, which is directly related to the uniformity of deposition layer, is increased to result in change of the deposition characteristics in time.

Low molecule organic electroluminescent material contains a large amount of organic material unstable to heat, and causes a problem of lowering the characteristics of the organic electroluminescent material by inducing resolution or change of the material characteristics due to excessive radiant heat in the deposition process. In addition, additional processes for cooling the chamber, exhausting the vacuum pressure, and re-vacuumizing are required to supply new deposition material to replenish the exhausted deposition material because the deposition process is conducted under high vacuum condition. Such additional processes cause loss of the process time.

In order to solve these problems, it is desirable to maintain uniformly the initial deposition characteristics (for example, vaporization rate of the deposition material) in supplying more deposition material in the deposition source at a time.

On the other hand, in the deposition source 10 with the structure shown in FIG. 2a and FIG. 2b, the side wall 11D acts as a heating unit (for example, structure which coils are wound around the side wall 11D). As shown in FIG. 1, however, since the sidewall 11D is exposed to the exterior, the thermal efficiency is lowered because all heat generated at the side wall 11D is not transferred to the deposition material 20 and some heat is radiated to the exterior.

In addition, as describe above, in progressing the deposition process, the deposition material 20 supplied in the deposition source 10 is consumed, and so the thickness of the deposition material 20 is decreased. Thus, heat is generated at the sidewall 11D corresponding to the portions without the deposition material and is not transferred directly to the deposition material, which contributes to energy waste.

Another drawback of the deposition source 10 is that the heat generated at the top plate 11A and the side wall 11D is not sufficiently transferred to the deposition material 20 located at the lower portion of the deposition source 10, that is, the deposition material 20 adjoining the surface of the bottom wall 11E. As a result, all of the deposition material 20 is not heated and vaporized. Particularly, depending on positions within the deposition source 10, the temperature of each deposition material 20 becomes different, that is, thermal gradient within the deposition source. Therefore, it is difficult to form a uniform deposition layer on the substrate.

SUMMARY OF THE INVENTION

An object of the present invention is to provide the deposition source which can compensate change of the distance between the heating means and the surface of the deposition material caused by decrease of the thickness of the deposition material according to consumption of the deposition material in the deposition process for the purpose of solving problems caused by increase of the distance between the top plate (heating means) of the deposition source and the surface of the deposition material supplied into the deposition source from the deposition process.

Another object of the present invention is to provide the deposition source which can enhance thermal efficiency through preventing heat generated at the heating means from exiting to the exterior by adding a heat-cutting function.

Further, another object of the present invention is to provide the deposition source for forming organic electroluminescent layers which can obtain a uniform deposition layer by minimizing factors of temperature change and by efficiently using all the deposition material through supplying heat to the deposition source adjoining the surface of the bottom wall.

The deposition source according to the present invention is installed in a chamber, heated by applied electric power to transfer heat to a vapor deposition material received therein and applying a vaporized deposition material generated therein to a substrate to form deposition organic electroluminescent layers onto the substrate, and comprises a vessel consisted of a top plate on which a vapor efflux aperture is formed, a side wall, and a bottom wall; a heating means for supplying heat to the deposition material received in the vessel, the heating means being capable of moving vertically; and a means for moving said heating means, the moving means being operated in response to the signal of a sensing means on varied distances between the heating means and the surface of said deposition material. Thus, the heating means is moved downward by the moving means to maintain the distance between the heating means and the surface of the deposition material at an initially-set value when the thickness of the deposition material is decreased.

Another deposition source according to the present invention is installed in a chamber, to form deposition organic electroluminescent layers onto the substrate, by applying a vaporized deposition material generated therein to a substrate, by transferring heat to a vapor deposition material received therein, heated by applied electric power, and comprises a vessel consisted of a top plate on which a vapor efflux aperture is formed, a side wall, and a bottom plate, the bottom plate being capable of moving vertically; a heating means for supplying heat to the deposition material received in the vessel; and a means for moving said bottom plate, the moving means being operated in response to the signal of a sensing means on varied distances between the heating means and the surface of the deposition material. Thus, the bottom plate is moved upward by the moving means to maintain the distance between the heating means and the surface of the deposition material and the distance between the substrate to be coated and the surface of the deposition material at an initially-set value when the thickness of the deposition material is decreased.

BRIEF DESCRIPTION OF THE DRAWINGS

The present invention will be more clearly understood from the detailed description in conjunction with the following drawings.

DETAILED DESCRIPTION OF THE INVENTION

Figure 1:
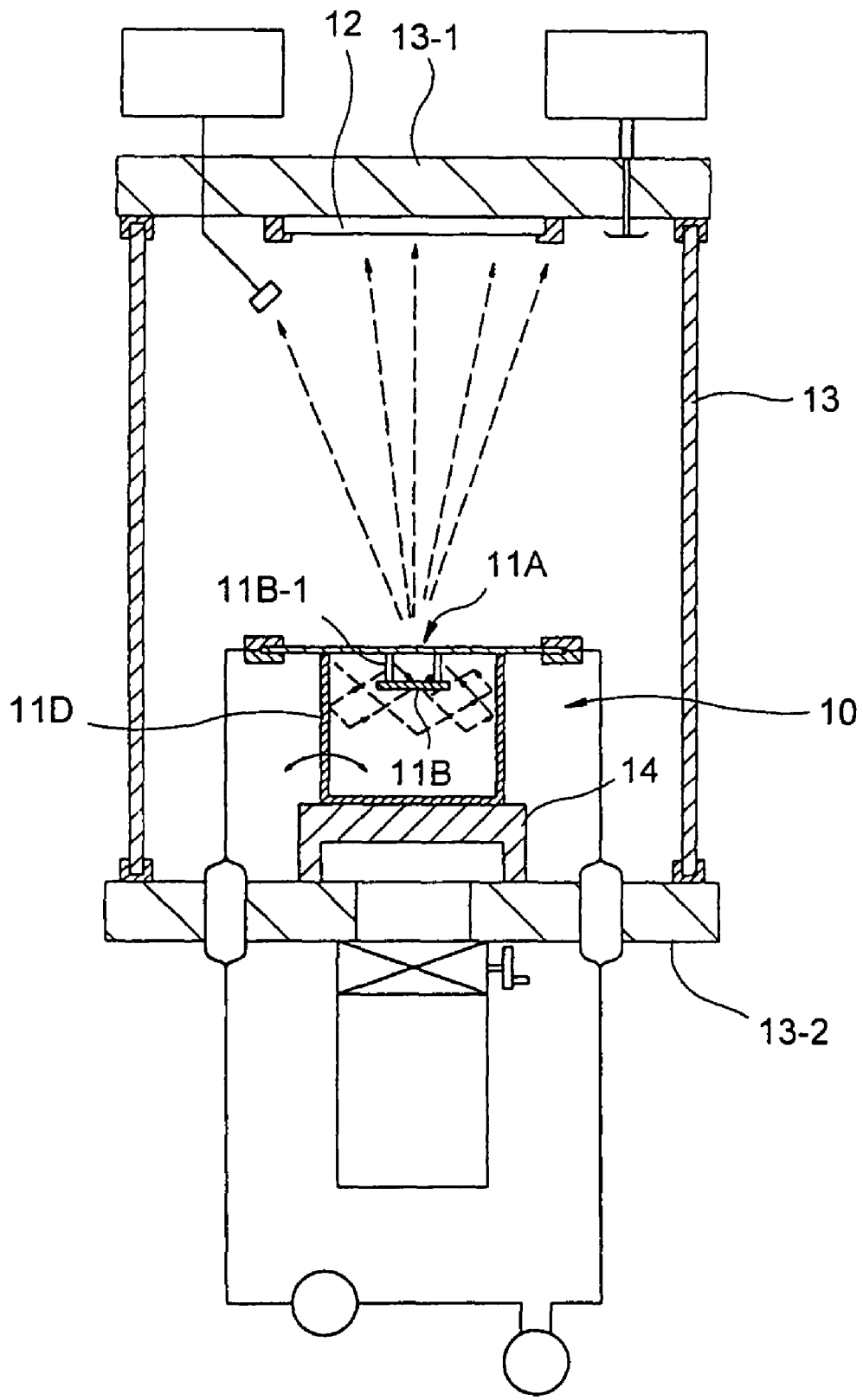
FIG. 1 is a schematic sectional view of a conventional apparatus for depositing an organic electroluminescent layer.
Figure 2:
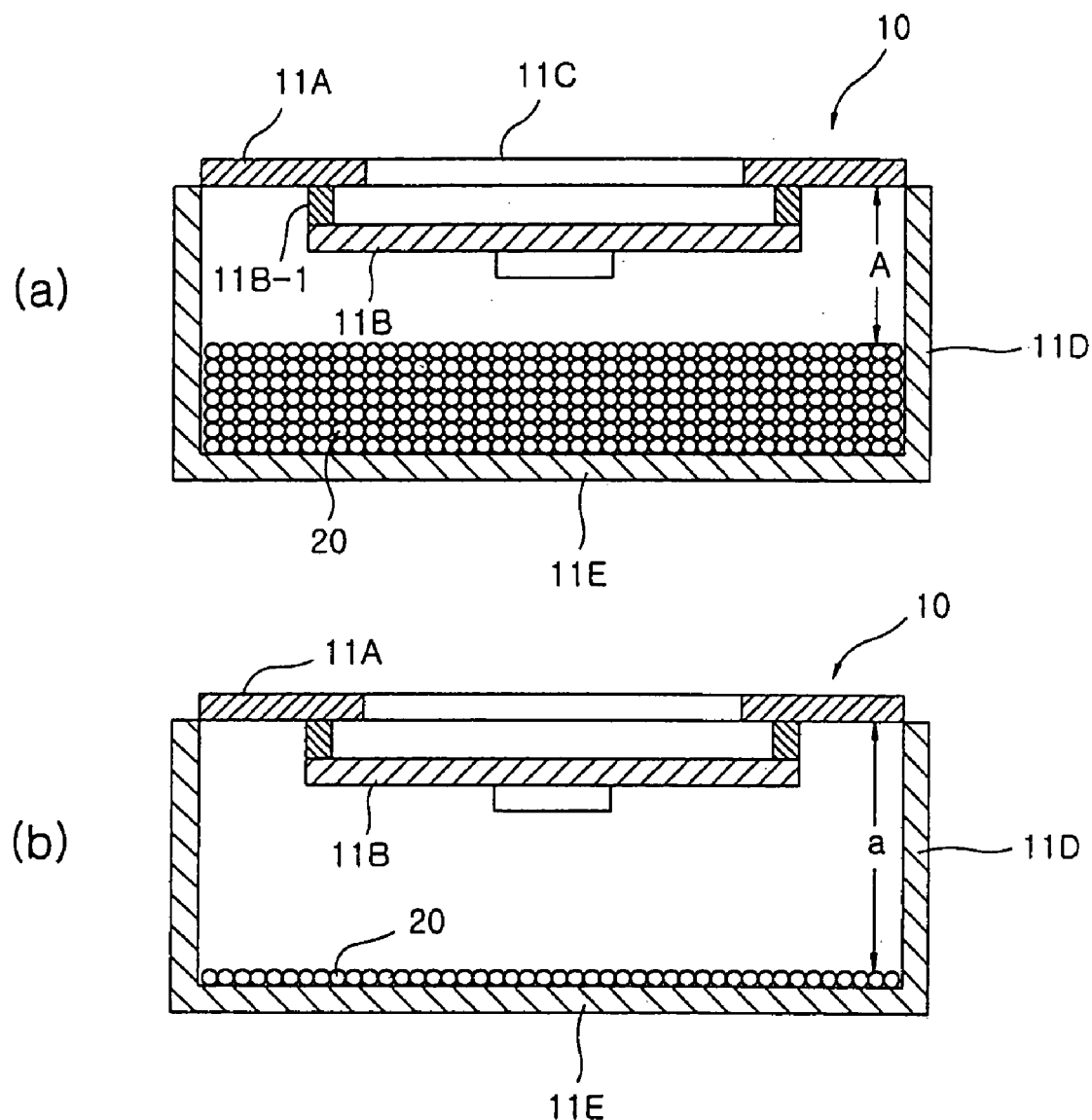
FIG. 2a is a sectional view showing the structure of the deposition source shown in FIG. 1 prior to performing the deposition process.
FIG. 2b is a sectional view showing change of the distance between the top plate of the deposition source and the deposition material in FIG. 1 after the deposition process is performed for a certain period of time.

Reference should be made to the drawings. The same reference numerals are used throughout the drawings to designate same or similar elements.

First Embodiment

Figure 3:
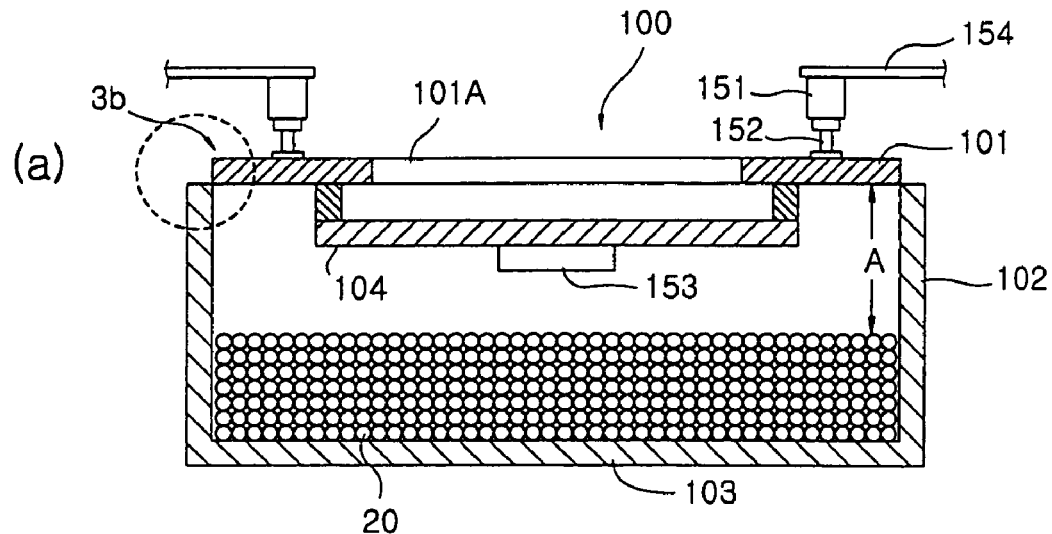
FIG. 3*a* is a sectional view of the deposition source according to the first embodiment of the present invention.
FIG. 3*b* is a detailed view of part 3*b* in FIG. 3*a*.
FIG. 3*c* is a view showing relationship between the top plate of the deposition source and the deposition material after the deposition process is completed.
Figure 3:
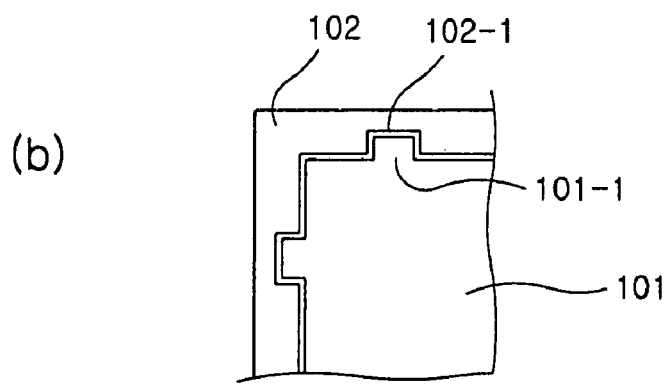
Figure 3:
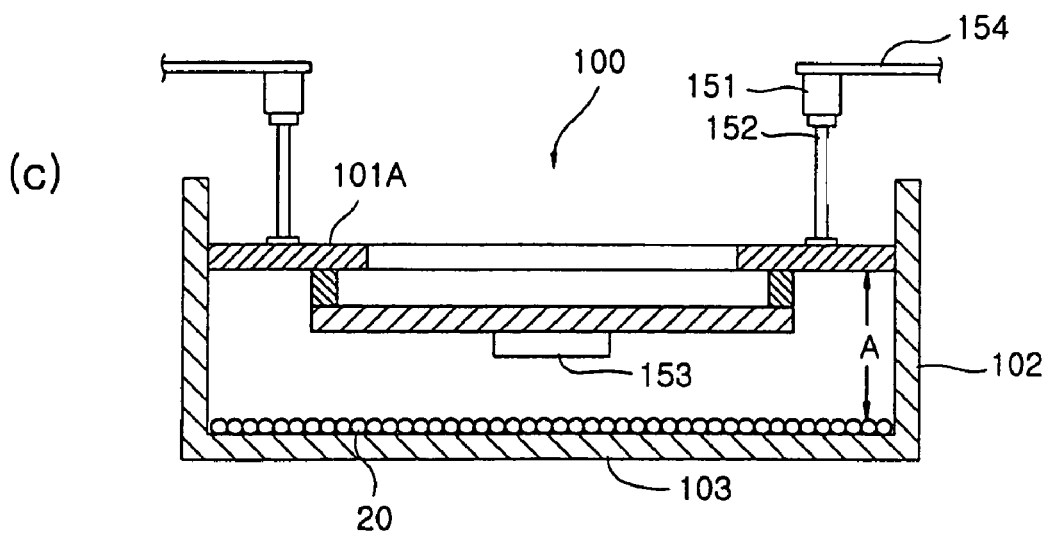

FIG. 3*a* is a sectional view of the deposition source according to the first embodiment of the present invention. A deposition source 100 according to the first embodiment is a vessel consisted of a top plate 101, a side wall 102, and a bottom wall 103. The deposition source 100 contains solid organic electroluminescent vapor deposition material 20 (hereinafter, referred to as "deposition material"). A vapor efflux aperture 11A is formed on the top plate 101. The function of the vapor efflux aperture 101A is to discharge vapor of vaporized deposition material from the deposition source 100. A baffle member 104 fixed to a lower surface of the top plate 101 corresponds to the efflux aperture 101A.

The top plate 101 can act as a heating means (heater) for supplying heat to the deposition material 20 or a separate heating means can be placed on (or below) the top plate 101. In the description below, a case where the top plate 101 acts as a heating means will be explained as an example.

The most important feature of the first embodiment as shown in FIG. 3*a* is that the top plate 101 of the deposition source 100 can be vertically moved. A movement means 151 to move the top plate 101 is mounted to the top plate 101.

The movement means 151 used in the deposition source 100 according to the first embodiment is a hydraulic or pneumatic cylinder. Two support brackets 154 fixed a the side wall of the chamber (13 in FIG. 1) are extended above the deposition source 100, and the cylinders 151 are mounted to each end portion of the brackets 154. Rods 152 of each cylinder 151 are fixed to both sides of the top plates 101, and therefore, each cylinder 151 does not have any effect on vapor efflux of the deposition material 20 through the aperture 101A of the top plate 101.

On the other hand, each cylinder 151 is controlled by a control means which is not shown in FIG. 3*a*, and the control means is connected to a sensing means 153 (for example, optical sensor) installed on the lower surface of the baffle 104 so that the control means can control each cylinder 151 according to a signal from the sensing means 153.

FIG. 3*b* is a detailed view showing part 3*b* in FIG. 3*a*. FIG. 3*b* shows partially the structure of the side wall 102 and the top plate 101 which can be vertically moved along the side wall 102 of the deposition source 100.

A number of vertical grooves 102-1 are formed on the inner surface of the side wall 102, and protrusions 101-1 are formed on the outer circumference surface of the top plate 101. Each protrusion 101-1 corresponds to each groove 102-1 and can be received in the corresponding groove 102-1 when the top plate 101 and the side wall 102 are assembled. Thus, when the top plate 101 is moved vertically, each protrusion 101-1 is moved along the corresponding groove 102-1. Consequently, the top plate 101 can be moved smoothly in the vertical direction without any deviation to the side wall 102 from the initial location.

FIG. 3*c* is a view showing relationship between the top plate of the deposition source and the deposition material after the deposition process is completed. The function of the deposition source constructed as described above will be explained in reference to FIG. 3*a* and FIG. 3*c*.

As explained above, in the depositing process, the quantity of the deposition material 20 received in the deposition source 100 is decreased gradually by the heating and vaporizing action. Thus, the distance between the surface of the deposition material 20 and the top plate 101 is changed (increased). The sensing means 153 mounted on the lower surface of the baffle 104 senses this change of the distance between the surface of the deposition material 20 and the top plate 101, and then transmits the sensed signal to the control means.

The control means calculates the distance between the surface of the deposition material 20 and the top plate 101 (that is, sum of the distance between the surface of the deposition material 20 and the sensing means 153, and the distance between the lower surface of the baffle 104 and the top plate 101) on the basis of the signals transmitted from the sensing means 153, and then compares the calculated distance with the initially-set distance (value).

As a result of the above comparison, if the distance between the surface of the deposition material 20 and the top plate 101 is changed, the control means operates each cylinder 151. By operating each cylinder 151, the rods 152 of each cylinder 151 are extended downward so that the top plate 101 fixed to the ends of the rods 152 is moved downward along the side wall 102.

If the distance between the surface of the deposition material 20 and the top plate 101 becomes the same as the initially-set distance (A in FIG. 3*a*) by downward movement of the top plate 101, that is, when the distance between the surface of the deposition material 20 and the top plate 101 calculated by the control means on the basis of the signals transmitted from the sensing means 153 becomes the same as the initially-set distance, the control means halts the operation of each cylinder 151.

The downward movement of the top plate 101 caused by the control means and each cylinder 151 is continued during the deposition process. After vaporizing all of the deposition material 20, the control means makes the rods 152 of each cylinder 151 return to the initial state as shown in FIG. 3*a*. Then, the top plate 101 of the deposition source 100 returns to its initial position, and thereafter, new deposition material is supplied to the deposition source 100.

On the other hand, FIG. 3a and FIG. 3c show that the optical sensor 153 acting as the sensing means is installed on the lower surface of the baffle 104, but the optical sensor 153 can be installed at any position including the lower surface of the top plate 101 as long as the optical sensor 153 does not hinder the deposition process and can sense the distance between the surface of the deposition material 20 and the top plate 101.

Second Embodiment

Figure 4:
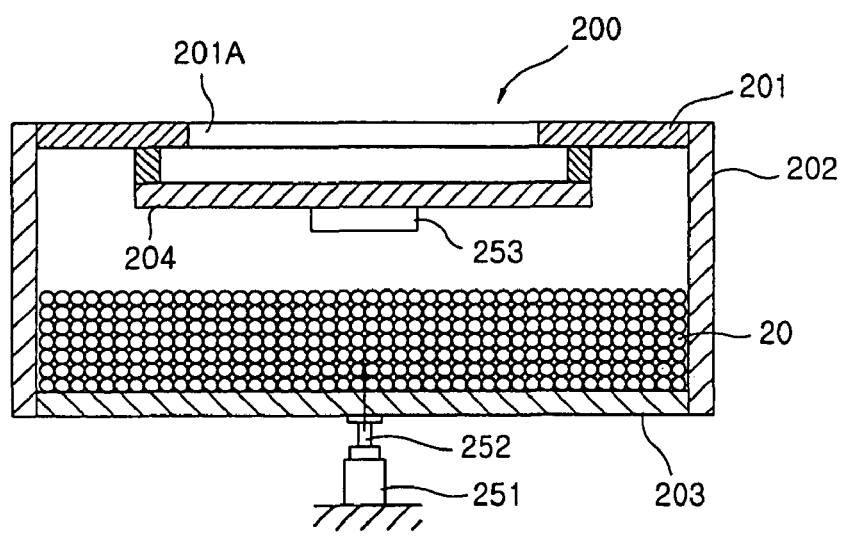
FIG. 4 is a sectional view of the deposition source according to the second embodiment of the present invention.

FIG. 4 is a sectional view of the deposition source according to the second embodiment of the present invention. The entire structure of a deposition source 200 according to this embodiment is the same as that of the deposition source 100 shown in FIG. 3a and FIG. 3c. In this embodiment, a top plate 201 can act as a heating means (heater) for supplying heat to the deposition material 20 or a separate heating means can be placed on (or below) the top plate 201. In the description below, a case where the top plate 201 acts as a heating means will be explained as an example.

The most important feature of the deposition source 200 according to the second embodiment is that a bottom plate 203 can be moved vertically in response to change of the distance between the surface of the deposition material 20 and the top plate 201.

As described above, the uniformity of the deposition layer to be formed on the surface of the substrate (12 in FIG. 1) depends on change of the distance between the substrate 12 and the deposition material 20. In the deposition source 100 shown in FIG. 3a, change of the distance between the top plate 101 and the deposition material 20 can be compensated by the vertical movement of the top plate 101, but a means to adjust change of the distance between the substrate 12 and the deposition material 20 is not disclosed.

In order to compensate change of the distance between the substrate 12 and the deposition material 20, the deposition source 200 according to this embodiment has the stricture which the bottom plate 203 can be moved vertically along a side wall 202.

A movement means 251 for moving the bottom plate 203 is mounted under the bottom plate 203 on which the deposition material 20 is located. The movement means used in the deposition source 200 according to the second embodiment is a hydraulic or pneumatic cylinder. The cylinder 251 is installed on a bottom wall 13-2 of the chamber 13 shown in FIG. 1, a rod 252 of the cylinder 251 is passed through the bottom wall 13-2, and the end of the rod 252 is fixed to the lower surface of the bottom plate 203. However, the structure shown in FIG. 4 is merely an example, and so the cylinder having another structure can be installed.

In the this embodiment, the cylinder 251 is controlled by a control means which is not shown in FIG. 4, the control means is connected to a sensing means 253 (for example, optical sensor) so that the control means controls the cylinder 251 according to the signal transmitted from the sensing means 253.

On the other hand, a number of vertical grooves are formed on the inner surface of the side wall 202, and a number of protrusions are formed on the outer circumference surface of the bottom plate 203. Each protrusion corresponds to each groove and can be received in the corresponding groove. Therefore, the bottom plate 203 can be moved smoothly in the vertical direction without any deviation to the side wall 202 from the initial location. This structure of the second embodiment is the same as that of the first embodiment as shown in FIG. 3c except difference of the member on which the protrusions are formed. Therefore, a further detailed description on the protrusions and grooves is omitted.

In the depositing process, the quantity of the deposition material 20 received in the deposition source 200 is decreased gradually by the heating and vaporizing actions. Thus, the distance between the substrate (12 in FIG. 1) and the deposition material 20 is increased (surely, the distance between the surface of the deposition material 20 and the top plate 201 is also increased, and the increased distance between the surface of the deposition material 20 and the top plate 201 is the same as the increased distance between the substrate 12 and the surface of the deposition material 20).

The sensing means 253 mounted to a lower surface of a baffle 204 senses change of the distance between the surface of the deposition material 20 and the top plate 201, and then transmits the sensed signal to the control means. The control means calculates the distance between the surface of the deposition material 20 and the top plate 201 on the basis of the signals transmitted from the sensing means 253, and then compares the calculated distance with the initially-set distance.

As a result of the above comparison, if the distance between the surface of the deposition material 20 and the top plate 201 is changed, the control means operates the cylinder 251 installed under the bottom plate 203. By operating of the cylinder 251, the rod 252 of the cylinder 251 is extended upward so that the bottom plate 203 fixed to the end of the rod 252 is moved upward along the side wall 202.

If the distance between the surface of the deposition material 20 and the top plate 201 becomes the same as the initially-set distance (A in FIG. 3a) by the upward movement of the bottom plate 203, that is, when the distance between the surface of the deposition material 20 and the top plate 201 calculated by the control means on the basis of the signals transmitted from the sensing means 253 becomes the same as the initially-set distance, the control means halts the operation of the cylinder 251.

The upward movement of the bottom plate 203 caused by the control means and the cylinder 251 is continued during the deposition process. After vaporizing all of the deposition material 20, the control means makes the rod 252 of the cylinder 251 return to the initial state. Then, the bottom plate 203 of the deposition source 200 returns to its initial position, and thereafter, new deposition material is supplied to the deposition source 200.

On the other hand, FIG. 4 shows that the optical sensor 253 acting as the sensing means is installed at the lower surface of the baffle 204, but the optical sensor can be installed at any positions including the lower surface of the top plate 201 as long as the optical sensor 253 does not hinder the deposition process and can sense the distance between the surface of the deposition material 20 and the top plate 201.

In the deposition sources 100 and 200 according to the first and second embodiments as described above, when the thickness of the deposition material 20 caused by consumption thereof during the deposition process is changed, the distance between the surface of the deposition material 20 and the top plate 101 (the first embodiment) or the distance between the surface of the deposition material 20 and the substrate 12 (the second embodiment) can be maintained at the initially-set distance by the movement of the top plate 101 (the first embodiment) or the bottom plate 203 (the second embodiment). Thus, an appropriate amount of heat is transferred to the deposition material 20 during the deposition process so that the deposition temperature of the deposition material 20 can be maintained uniformly and the optimum deposition rate can be maintained.

In the second embodiment, especially, the distance between the top plate 201 and the deposition material 20 as well as the optimum distance between the substrate and the deposition material are always maintained, and so it is possible to form a uniform deposition layer. Also, the deposition material adjoining the surface of the bottom plate 203 can be vaporized so that it is possible to minimize the residual of the deposition material.

In particular, in a case where the deposition material is supplied to the maximum, all of the deposition material can be vaporized, and the time loss caused by vacuuming, heating, and cooling processes to be performed in the deposition chamber after replenishing the deposition material can be minimized. Therefore, the second embodiment enables the depth of the deposition source to make deeper than the conventional depositional source, and so the quantity of the deposition material supplied to the deposition source can be maximized.

Third Embodiment

Figure 5:
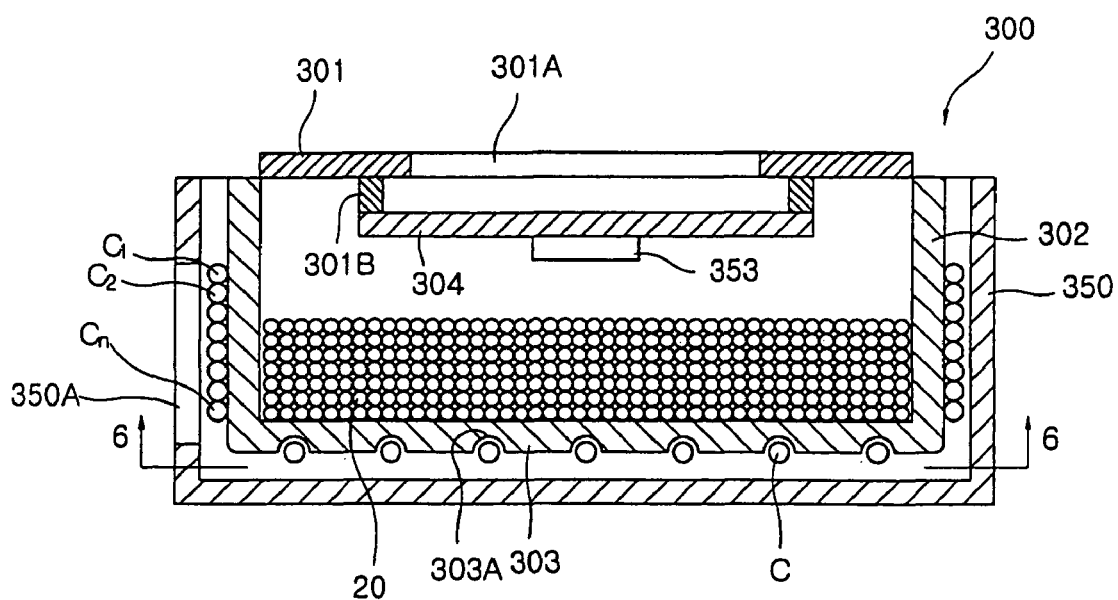
FIG. 5 is a sectional view of the deposition source according to the third embodiment of the present invention.

FIG. 5 is a sectional view of the deposition source according to the third embodiment of the present invention. The deposition source 300 according to this embodiment has a vessel consisted of a top plate 301 acting as the heating means, a side wall 302, and a bottom wall 303. The structure of the top plate 301, on which a vapor efflux aperture 301A is formed and to which a baffle member 304 is fixed, is the same as the top plates 101 and 201 of the deposition sources 100 and 200 of the first and second embodiments, respectively. Therefore, a further detailed description thereon is omitted.

The important aspect of the deposition source 300 shown in FIG. 5 is that a number of coils C1, C2, . . . Cn as a heating means for transferring heat to the deposition material 20 are wound around the side wall 302, and a casing 350 is located at the outer side of the side wall 302.

A number of coils C1, C2, . . . Cn are wound on the outer circumference surface of the side wall 302. The uppermost coil C1 coincides with the surface of the deposition material 20 received in the deposition source with the maximum height (thickness), and the lowermost coil Cn coincides with the surface of the bottom wall 303.

The coils C1, C2, . . . Cn are arranged for electric power to be individually applied thereto. A control means (not shown) controls the electric power applied to each coil C1, C2, . . . Cn, and the control means is connected to a sensing means 353 (for example, optical sensor) which is mounted to the interior of the deposition source.

The function of the coils C1, C2, . . . Cn arranged and described as above is as follows.

In the early stage of the deposition process, the surface of the deposition material 20, which is supplied into the deposition source 20 with the maximum height, coincides with the uppermost coil C1. At this time, electric power is applied to only the uppermost coil C1, not the other coils C2, . . . Cn, by the control means. The upper side of the deposition material 20 is heated and vaporized by the heat generated at the top plate 301 acting as a heating means and by the heat generated at the uppermost coil C1.

In the depositing process, the quantity of the deposition material 20 received in the deposition source 200 is decreased gradually by the heating and vaporizing action (that is, decrease of the height of the deposition material 20).

The sensing means 353 mounted on the lower surface of the baffle 304 senses change of the height of the deposition material 20, and transmits the sensed signal to the control means. Then, the control means calculates the height of the deposition material 20 on the basis of the signals transmitted from the sensing means 353. According to the calculated height of the deposition material 20, the control means controls the electric power applied to the other coils C1, C2, . . . Cn.

That is, when the height of the deposition material 20 is reduced and the surface of the deposition material 20 corresponds to the second coil C2 positioned below the uppermost coil C1, the control means blocks the electric power applied to the uppermost coil C1 and applies the electric power to the second coil C2.

In succession, if the surface of the deposition material 20 corresponds to the lowermost coil Cn, the control means applies the electric power to the lowermost coil Cn and blocks the electric power applied to the other coils C1, C2 . . .

As described above, in the depositing process, even though the height of the deposition material 20 is changed, any one coil to which the electric power is applied always corresponds to a portion of the deposition material 20 to which the heat generated by the top plate 301 is transferred. Therefore, it is possible to prevent the heat generated by the coils C1, C2, . . . Cn from transferring unnecessarily to the portion of the deposition material which heating and vaporizing do not take place and the deposition material is not present.

On the other hand, the casing 350 located at the outer side of the side wall 302 prevents the heat generated at each coil C1, C2, . . . Cn from radiating outward. Thus, most of the heat generated at each coil C1, C2, . . . Cn is transferred to the deposition material 20 through the side wall 302 so that it is possible to minimize heat loss. Particularly, if the space formed between the side wall 302 and the outer casing 350 is filled with a thermal insulation material, the heat radiation is prevented more effectively to minimize thermal gradient in the entire system. The reference numeral 350A indicates the opening formed on the casing 350 for connecting power lines to the coils C1, C2, . . . Cn.

More excellent adiabatic property can be obtained by forming the casing 350 with oxide or nitride of aluminum (Al), zirconium (Zr), silicon (Si), yttrium (Y), etc., having high thermal capacity.

Figure 6:
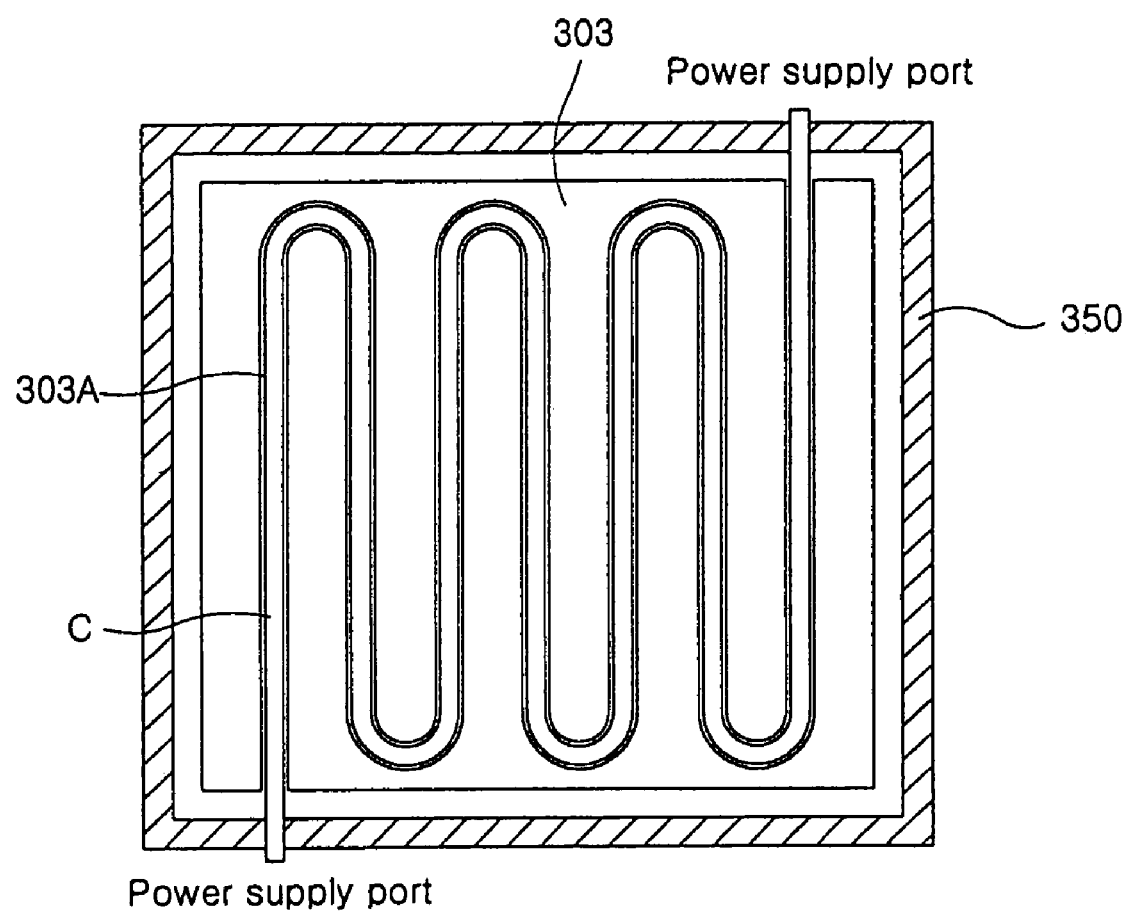
FIG. 6 is a sectional view taken along line 6—6 in FIG. 5.

Another feature of the deposition source according to this embodiment is shown in FIG. 6. FIG. 6 is a sectional view taken along the line 6—6 in FIG. 5 and shows a recess 303A formed at the lower surface of the bottom wall 303 and a coil C received in the recess 303A.

The recess 303A is formed to the longitudinal (or widthwise) direction on the bottom wall 303, and consists of many linear portions and connection portions connecting two neighboring linear portions. Thus, the single coil C is spread on the entire surface of the bottom wall 303. Both ends of the coil C are connected to the power supply (not shown).

When the deposition process is performed, the electric power is applied to any one of the coils C1, C2, . . . Cn wound around the side wall 302 as well as the coil C received in the recess 303A of the bottom wall 303 (surely, the electric power is applied to the top plate 301 acting as a heating means). Therefore, the heat generated at the coil C received in the recess 303A of the bottom wall 303 is transferred to the deposition material adjoining the surface of the bottom wall 303.

In the deposition source according to third embodiment as described above, in the processing the depositing process, even though a height of the deposition material is changed, the coil to which the electric power is applied is always corresponded to a portion of the deposition material to which heat generated by the top plate is transferred. Therefore, it is possible to prevent heat generated by the coils from transferring unnecessarily to a portion of the deposition material which is not heated and vaporized and a portion of the deposition source in which the deposition material is not present.

Also, the casing provided at the exterior of the side wall prevents the heat generated at the coils mounted to the side wall from radiating outward, and so most generated heat is transferred to the deposition material through the side wall to minimize thermal gradient in the entire system.

In addition, when an additional coil is provided at the bottom wall of the deposition source, sufficient heat can be transferred to the deposition material which is remotely located from the heating means (that is, the deposition material adjoining the surface of the bottom wall), and so all of the deposition material can be used effectively and a uniform deposition layer can be obtained.

Fourth Embodiment

Figure 7:
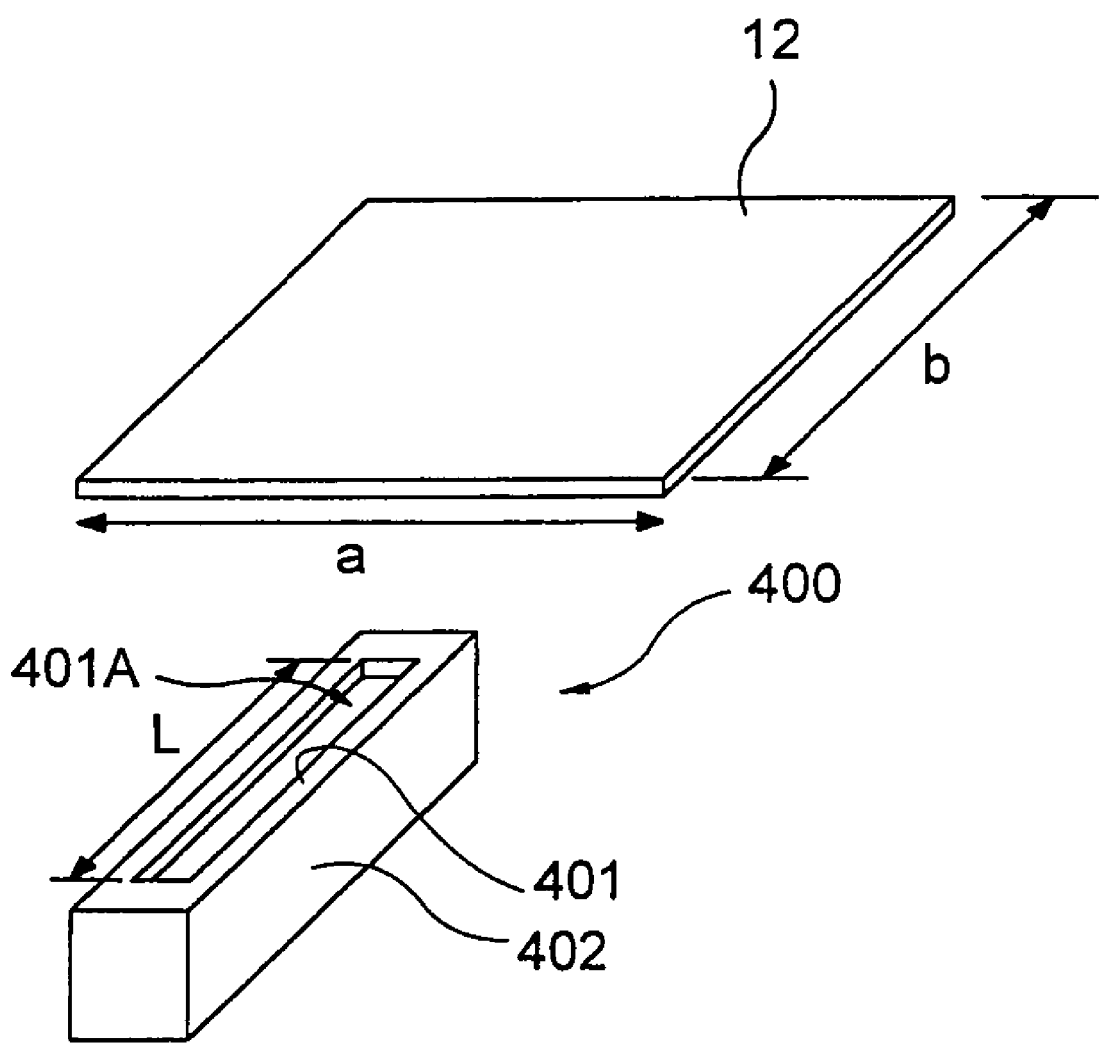
FIG. 7 is a schematic perspective view showing relationship between the substrate and the deposition source according to the fourth embodiment.

FIG. 7 is a schematic perspective view showing relationship between the deposition source according to the fourth embodiment and the substrate. An inner structure of the deposition source 400 is not shown in FIG. 7.

The deposition source 400 according to this embodiment is consisted of a top plate 401 with certain length and width, a side wall 402, and a bottom wall. A vapor efflux aperture 401A is formed on the top plate 401. An organic electroluminescent vapor deposition material is received in the space formed by the top plate 401, the side wall 402, and the bottom wall.

A feature of this embodiment is to constitute the deposition source 400 whose effective deposition length (that is, length A of the vapor efflux aperture 401A of the top plate 401 actually contributing to the deposition process) is longer than, or the same as, the width b of the substrate 12 on which the electroluminescent layer is formed.

FIG. 8a is a plane view of the substrate showing the initial state that the electroluminescent layer is formed on the surface of the substrate by means of the deposition source 400 shown in FIG. 7. If the deposition source 400 as described above is used for forming the electroluminescent layer on the surface of the substrate 12, the deposition material's vapor is diffused through the aperture 400A of the top plate 401, and then dispersed and deposited uniformly on the surface of the substrate 12 over the entire width.

Figure 8:
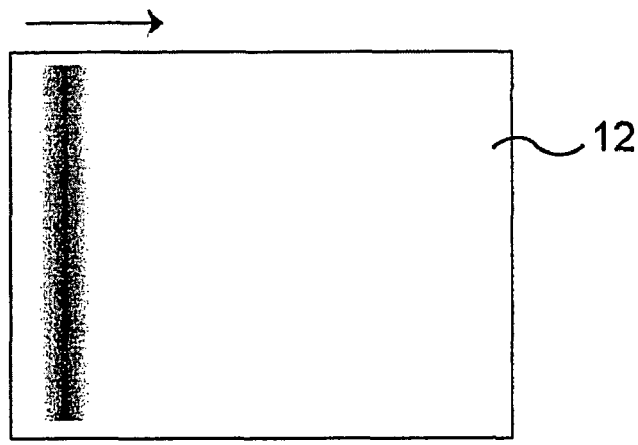
FIG. 8*a* is a plane view of the substrate showing the initial state which the electroluminescent layer is deposited on the surface using the deposition source shown in FIG. 7.
FIG. 8*b* is a plane view of the substrate showing the state that deposition of the electroluminescent layer has been completed under the state that the deposition source (or substrate) shown in FIG. 7 has been moved.
Figure 8:
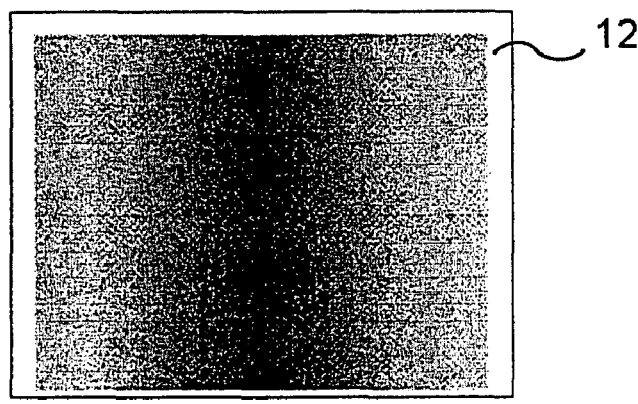
Figure 9:
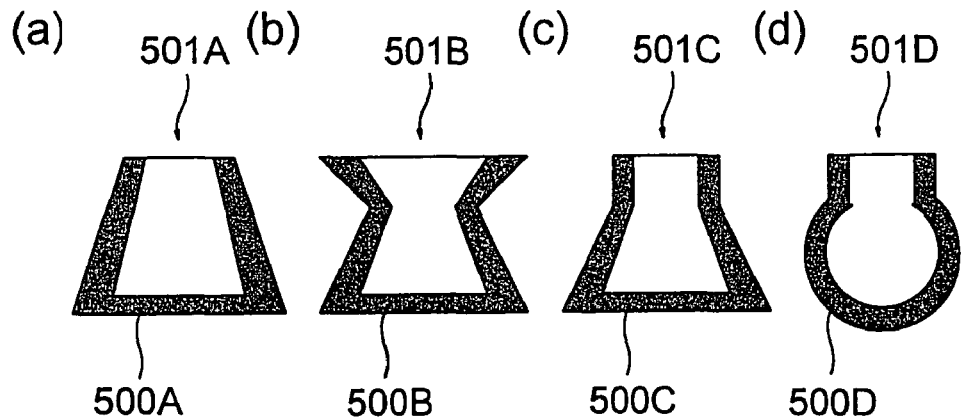
FIG. 9*a* and FIG. 9*b* are schematic sectional views showing various shapes of the deposition source according to the fourth embodiment of the present invention.

The more effective deposition process can be performed by moving the deposition source 400 constructed as described above or the substrate 20 to the longitudinal direction of the substrate. That is, when the deposition source 400 or the substrate 20 is moved horizontally (linearly) to the arrow direction shown in FIG. 8, the electroluminescent layer as shown in FIG. 8a is continuously deposited on the surface of the substrate 12 over the entire length. Ultimately, as shown in FIG. 8b showing the surface of the substrate on which the deposition of the electroluminescent layer is completed after moving horizontally the deposition source 400 or the substrate 12, the uniform electroluminescent layer is formed on the entire surface of the substrate 12.

On the other hand, each respective deposition source 100, 200, 300 and 400 described in the first to fourth embodiments has the inner space divided into the lower and upper portion, and the cross sectional surface of the lower portion is the same as that of the upper portion. Therefore, the flow rate of vapor of the deposition material at the lower portion is practically equal to the flow rate at the upper portion. Also, due to the large surface area of the upper portion of the deposition source, heat loss of the deposition material in the inner space is increased. In order to eliminate the above drawbacks, the present invention modified the shape of the deposition source.

FIG. 9a to FIG. 9d are sectional views of the deposition sources, and show various shapes of the deposition source according to the present invention. Another feature of the deposition sources 500A, 500B, 500C, and 500D according to the present invention is that the sectional surface area of the upper portion at which the aperture is formed is smaller than that of the lower portion.

Though the sectional surface areas in a tube can be different in different positions, the quantity of flow is same anywhere in the tube, and therefore, the flow rate of a portion having smaller sectional surface area is higher than that of another portion having larger sectional surface area.

Consequently, just before diffusing vapor of the deposition material through the aperture, the flow rate of vapor at the upper portion having smaller sectional surface area is higher than that of vapor at the lower portion of the deposition source. Higher flow rate induces increase of the vapor's kinetic energy (molecules of the vaporized deposition material), and so the density and uniformity of the deposition layer formed on the substrate can be enhanced. Also, since the sectional surface area of the upper portion through which the vapor of the deposition material is diffused is small, heat loss outward can be minimized and the deposition source is not influenced by such exterior interference as change of ambient temperature.

In the present invention, on the other hand, a material having higher thermal capacity than quartz, for example, oxide or nitride of aluminum (Al), zirconium (Zr), silicon (Si), or yttrium (Y), or composite material of at least two above, is used as the deposition source's material. The thermal capacity of these metal oxide or nitride is larger than organic material used as the deposition material (about 3:1), and therefore, the adiabatic property of the deposition source can be improved.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. A deposition source installed in a chamber, heated by applied electric power to transfer heat to a vapor deposition material received therein and applying a vaporized deposition material generated therein to a substrate to form deposition organic electroluminescent layers onto the substrate, comprising;

a vessel comprising a top plate on which a vapor efflux aperture is formed, a side wall, and a bottom wall;

a heating means for supplying heat to the deposition material received in said vessel, said heating means being capable of moving vertically;

a sensing means for sensing varied distances between said heating means and the surface of said deposition material; and a means for moving said heating means, said moving means being operated in response to a signal of the sensing means on the varied distances between said heating means and the surface of said deposition material, whereby said heating means is moved downward by said moving means to maintain the distance between said heating means and the surface of the deposition material at an initially-set value when the thickness of the deposition material is decreased, wherein said side wall has a number of vertical grooves formed on the inner surface thereof, and said top plate has a number of protrusions formed on the outer circumference surface thereof, each of said protrusions has such a size that each protrusion can be received in each of said grooves so that each of said protrusions of said top plate is moved along each of said grooves of said side wall when said top plate is moved vertically.

2. The deposition source according to claim 1, wherein said sensing means and said heating means are mounted to said top plate, said moving means comprises a number of cylinders supported by said chamber and for moving said top plate vertically with having rods fixed to said top plate; and a control means receiving a signal from said sensing means and controlling said cylinders in response to the transmitted signal, whereby said cylinders make said top plate move downward along said side wall when the distance between said top plate and said deposition material is larger than the initially-set value.

3. The deposition source according to claim 2, wherein each of said cylinders is installed at the outer side which does not correspond to said vapor efflux aperture formed on said top plate so that each of said cylinders does not affect the flow of vapor of said deposition material escaped through said vapor efflux aperture.

4. A deposition source installed in a chamber, to form deposition organic electroluminescent layers onto the substrate, by applying a vaporized deposition material generated therein to a substrate, by transferring heat to a vapor deposition material received therein, heated by applied electric power, comprising;
 a vessel comprising a top plate on which a vapor efflux aperture is formed, a side wall, and a bottom plate, said bottom plate being capable of moving vertically;
 a heating means for supplying heat to said deposition material received in said vessel;
 a sensing means for sensing varied distances between said heating means and the surface of said deposition material; and
 a means for moving said bottom plate, said moving means being operated in response to a signal of the sensing means on the varied distances between said heating means and the surface of said deposition material, whereby said bottom plate is moved upward by said moving means to maintain the distance between said heating means and the surface of the deposition material and the distance between said substrate to be coated and the surface of the deposition material at an initially-set value when the thickness of the deposition material is decreased, wherein said side wall has a number of vertical grooves formed on the inner surface thereof, and said bottom plate has a number of protrusions formed on the outer circumference surface thereof, each of said protrusions has such a size that each protrusion can be received in each of said grooves so that each of said protrusions of said bottom plate is moved along each of said grooves of said side wall when said bottom plate is moved vertically.

5. The deposition source according to claim 4, wherein said moving means comprises
 a cylinder supported by said chamber and for moving vertically said bottom plate with having a rod fixed to said bottom plate; and
 a control means receiving a signal transmitted from said sensing means mounted to said top plate and controlling said cylinder in response to the transmitted signal, whereby said cylinder makes said bottom plate move upward along said side wall when the distance between said heating means and the surface of said deposition material is larger than the initially-set value.

6. The deposition source according to claim 4, wherein said sensing means is an optical sensor.

7. A deposition source installed in a chamber, heated by applied electric power to transfer heat to a vapor deposition material received therein and applying a vaporized deposition material generated therein to a substrate to form deposition organic electroluminescent layers onto the substrate, comprising;
 a vessel comprising a top plate on which a vapor efflux aperture is formed, a side wall, and a bottom wall;
 a heating device configured to supply heat to the deposition material received in said vessel, said heating device being capable of moving vertically;
 a sensing device configured to sense varied distances between said heating device and the surface of said deposition material; and
 a moving device configured to move said heating device, said moving device being operated in response to a signal of the sensing device on the varied distances between said heating device and the surface of said deposition material, whereby said heating device is moved downward by said moving device to maintain the distance between said heating device and the surface of the deposition material at an initially-set value when the thickness of the deposition material is decreased, wherein said side wall has a number of vertical grooves formed on the inner surface thereof and said top plate has a number of protrusions formed on the outer circumference surface thereof, each of said protrusions has such a size that each protrusion can be received in each of said grooves so that each of said protrusions of said top plate is moved along each of said grooves of said side wall when said top plate is moved vertically.

8. The deposition source according to claim 7, wherein said sensing device and said heating device are mounted to said top plate, said moving device comprises a number of cylinders supported by said chamber and for moving said top plate vertically with having rods fixed to said top plate; and a control device configured to receive a signal from said sensing device and control said cylinders in response to the transmitted signal, whereby said cylinders make said top plate move downward along said side wall when the distance between said top plate and said deposition material is larger than the initially-set value.

9. The deposition source according to claim 8, wherein each of said cylinders is installed at the outer side which does not correspond to said vapor efflux aperture formed on said top plate so that each of said cylinders does not affect the flow of vapor of said deposition material escaped through said vapor efflux aperture.

10. A deposition source installed in a chamber, to form deposition organic electroluminescent layers onto the substrate, by applying a vaporized deposition material generated therein to a substrate, by transferring heat to a vapor deposition material received therein, heated by applied electric power, comprising;
 a vessel comprising a top plate on which a vapor efflux aperture is formed, a side wall, and a bottom plate, said bottom plate being capable of moving vertically;
 a heating device configured to supply heat to said deposition material received in said vessel;

a sensing device configured to sense varied distances between said heating device and the surface of said deposition material; and a moving device configured to move said bottom plate, said moving device being operated in response to a signal of the sensing device on the varied distances between said heating device and the surface of said deposition material, whereby said bottom plate is moved upward by said moving device to maintain the distance between said heating device and the surface of the deposition material and the distance between said substrate to be coated and the surface of the deposition material at an initially-set value when the thickness of the deposition material is decreased, wherein said side wall has a number of vertical grooves formed on the inner surface thereof, and said bottom plate has a number of protrusions formed on the outer circumference surface thereof, each of said protrusions has such a size that each protrusion can be received in each of said grooves so that each of said protrusions of said bottom plate is moved along each of said grooves of said side wall when said bottom plate is moved vertically.

11. The deposition source according to claim 10, wherein said moving device comprises:

a cylinder supported by said chamber and for moving vertically said bottom plate with having a rod fixed to said bottom plate; and a control device configured to receive a signal transmitted from said sensing device mounted to said top plate and control said cylinder in response to the transmitted signal, whereby said cylinder makes said bottom plate move upward along said side wall when the distance between said heating device and the surface of said deposition material is larger than the initially-set value.

12. The deposition source according to claim 10, wherein said sensing device is an optical sensor.

* * * * *